United States Patent
Boerstler et al.

(10) Patent No.: US 7,895,005 B2
(45) Date of Patent: Feb. 22, 2011

(54) DUTY CYCLE MEASUREMENT FOR VARIOUS SIGNALS THROUGHOUT AN INTEGRATED CIRCUIT DEVICE

(75) Inventors: David W. Boerstler, Round Rock, TX (US); Eskinder Hailu, Austin, TX (US); Masaaki Kaneko, Round Rock, TX (US); Jieming Qi, Austin, TX (US); Bin Wan, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 11/942,966

(22) Filed: Nov. 20, 2007

(65) Prior Publication Data

US 2009/0128133 A1    May 21, 2009

(51) Int. Cl.
*G01R 13/00* (2006.01)
(52) U.S. Cl. .............. 702/66; 702/79; 702/89; 702/107; 702/125; 702/176; 702/178; 327/174; 327/175
(58) Field of Classification Search ............ 702/66, 702/79, 89, 107, 125, 176, 178; 327/174, 327/175
See application file for complete search history.

(56) References Cited

U.S. PATENT DOCUMENTS

| | | | |
|---|---|---|---|
| 3,660,767 A * | 5/1972 | Yoshino et al. ............. | 327/115 |
| 4,552,118 A | 11/1985 | Fukaya | |
| 4,675,597 A | 6/1987 | Hernandez | |
| 4,814,872 A | 3/1989 | Ivie | |
| 4,859,944 A | 8/1989 | Webb | |
| 4,962,431 A | 10/1990 | Imakawa et al. | |
| 5,367,200 A | 11/1994 | Leonida | |
| 5,933,399 A | 8/1999 | Kim | |

(Continued)

FOREIGN PATENT DOCUMENTS

EP    0957605 A2    11/1999

OTHER PUBLICATIONS

U.S. Appl. No. 11/383,570, filed May 16, 2006, Boerstler et al.

(Continued)

*Primary Examiner*—Drew A Dunn
*Assistant Examiner*—Hyun Park
(74) *Attorney, Agent, or Firm*—Francis Lammes; Stephen J. Walder, Jr.; Matthew B. Talpis

(57) ABSTRACT

A mechanism is provided for measuring the absolute duty cycle of a signal anywhere on an integrated circuit device. The mechanism employs a circuit having a plurality of substantially identical pulse shaper elements, each of which expand the pulse of an input signal whose duty cycle is to be measured by a same amount. The outputs of the pulse shaper elements may be coupled to substantially identical divider circuits whose outputs are coupled to a multiplexer that selects two inputs for output to a set of master/slave configured flip-flops, one input serving as a clock and the other as data to the flip-flops. The flip-flops sample the divider outputs selected by the multiplexer to detect if the dividers have failed or not. The outputs of the flip-flops are provided to an XOR gate which outputs a duty cycle signal indicative of the duty cycle of the input signal.

16 Claims, 7 Drawing Sheets

U.S. PATENT DOCUMENTS

| | | | |
|---|---|---|---|
| 6,084,452 | A | 7/2000 | Drost et al. |
| 6,150,847 | A * | 11/2000 | Lu .............................. 326/93 |
| 6,486,649 | B1 * | 11/2002 | Yin et al. ................. 324/76.39 |
| 6,664,834 | B2 | 12/2003 | Nair et al. |
| 6,700,530 | B1 | 3/2004 | Nilsson |
| 6,798,266 | B1 | 9/2004 | Vu et al. |
| 6,847,244 | B2 | 1/2005 | Pillay et al. |
| 6,917,662 | B2 * | 7/2005 | Austin et al. .................. 377/47 |
| 7,002,358 | B2 | 2/2006 | Wyatt |
| 7,227,809 | B2 | 6/2007 | Kwak |
| 2002/0097035 | A1 | 7/2002 | Atallah et al. |
| 2005/0225314 | A1 | 10/2005 | Belleau |
| 2007/0086267 | A1 * | 4/2007 | Kwak .......................... 365/233 |

OTHER PUBLICATIONS

U.S. Appl. No. 11/555,018, filed Oct. 31, 2006, Boerstler et al.
U.S. Appl. No. 11/380,982, filed May 1, 2006, Boerstler et al.
U.S. Appl. No. 11/381,031, filed May 1, 2006, Boerstler et al.
U.S. Appl. No. 11/381,050, filed May 1, 2006, Boerstler et al.
"Charge Pumps Shine in Portable Designs", Dallas Semiconductor, Maxim Application Note 669, (Mar. 15, 2001), www.maxim-ic.com/an669, 15 pages.
Tsang et al., "Picosecond imaging circuit analysis", IBM Corporation, IBM JRD, vol. 44, No. 4, (Jul. 4, 2000), pp. 583-603.
Bhatti et al., "Duty Cycle Measurement and Correction Using a Random Sampling Technique", Proceedings of the 48$^{th}$ IEEE Int'l. Midwest Symposium on Circuits & Systems, (Aug. 2005), 4 pages.
"Cell Broadband Engine Architecture", IBM Corporation, Ver. 1.0, (Aug. 8, 2005), 67 pages.
Matano et al., "A 1-Gb/s/pin 512-Mb DDRII SDRAM using a digital DLL and a slew-rate-controlled output buffer", downloaded from www.elpida.com on Mar. 13, 2006, 2 pages.
Nam et al., "An All-Digital CMOS Duty Cycle Correction Circuit with a Duty-Cycle Correction Range of 15-to-85% for Multi-Phase Applications", IEICE Trans. Electron., vol.E88-C, No. 4, (Apr. 2005), pp. 773-777.
Page, M., "IBM's Cell Processor: Preview to Greatness?", (May 15, 2005), 6 pages.
Travis et al., "Circuit conditions variable-duty-cycle clock", EDN Access, (Feb. 17, 1997), http://www.edn.com/archives/1997/021797/04DI_OI.htm, 2 pages.
U.S. Appl. No. 12/129,980, Image File Wrapper on Mar. 12, 2010, 1 page.
Office Action mailed Jul. 2, 2010 for U.S. Appl. No. 12/129,980, 33 pages.
Notice of Allowance mailed Nov. 12, 2010, U.S. Appl. No. 12/129,980, 17 pages.
Response to Office Action filed Sep. 30, 2010, U.S. Appl. No. 12/129,980, 15 pages.

* cited by examiner

DUTY CYCLE MEASUREMENT FOR VARIOUS SIGNALS THROUGHOUT AN INTEGRATED CIRCUIT DEVICE

BACKGROUND

1. Technical Field

The present application relates generally to an improved duty cycle measurement apparatus and method. More specifically, the present application is directed to an inexpensive absolute duty cycle measurement method and apparatus which may be used throughout an integrated circuit device to measure the duty cycle of a variety of signals.

2. Description of Related Art

Conventional clock signal generator circuits allow the designer to vary the duty cycle of a clock signal that the circuit produces. During a clock period, a clock signal exhibits a logic high for a portion of the period and a logic low for the remainder of the period. Duty cycle refers to the percentage of a clock period that the clock signal exhibits a particular logic state (e.g., a logic high state). A signal that exhibits a logic high state for 50% of the signal period corresponds to a 50% duty cycle. Similarly, a signal that exhibits a logic high state for 40% of a signal period corresponds to a 40% duty cycle. Of course, the designer may alternatively employ inverted logic and define the duty cycle in terms of the percentage of a signal period that the signal exhibits a logic low state.

At relatively low frequencies up to and including the MHz range, it is not difficult to measure incremental changes or adjustments to the duty cycle of a digital signal. However, when dealing with clock circuits in the GHz range, the designer experiences significantly more difficulty in measuring small changes in the duty cycle of a digital signal. In terms of time instead of frequency, incremental adjustments to the clock duty cycle or pulse duration in the picosecond range are very difficult to measure.

One solution for measuring changes to the duty cycle of a clock signal in the picosecond range is a high speed oscilloscope with very large bandwidth. Unfortunately, a laboratory set up with a multi-GHz scope is expensive to implement and maintain. Moreover, care must be taken to assure that whatever circuitry couples the clock signal from a logic chip to the scope does not introduce jitter exceeding the duration of the incremental adjustment to the duty cycle.

Another approach to measuring changes to the duty cycle of a clock signal on an integrated circuit (IC) is picosecond imaging circuit analysis (PICA). The PICA method detects photons of light emitted on the leading and trailing edges of clock pulses to determine their duty cycle. While this type of duty cycle analysis works well, it is extremely expensive to implement. Moreover, this type of analysis destroys the component under test.

The most popular way to extract absolute duty cycle is by driving the signal through a low pass filter. The output of the low pass filter will have a value that is representative of the duty cycle of the input signal. However, implementation of the low pass filter requires a large resistor and capacitor. This adds to the overall chip size.

SUMMARY

The illustrative embodiments provide a method and apparatus for measuring the absolute duty cycle of a signal, such as a clock signal, anywhere on an integrated circuit device. The method and apparatus employ a circuit having a plurality of substantially identical pulse shaper elements each of which expands the pulse of an input signal, e.g., a clock signal, whose duty cycle is to be measured by a same amount $\tau$. The inputs to these pulse shaper elements are connected in series along a first path such that a first pulse shaper element expands the logic high pulse by $\tau$, a second pulse shaper expands the logic high pulse by $2\tau$, a third pulse shaper element expands the logic high pulse by $3\tau$, etc. up to an nth pulse shaper element that expands the logic high pulse by $n\tau$. Similarly, along a second path in which the input signal is inverted, the inputs to the pulse shaper elements are connected in series such that a fourth pulse shaper element expands a logic low pulse by $\tau$, a fifth pulse shaper expands the logic low pulse by $2\tau$, a third pulse shaper element expands the logic low pulse by $3\tau$, etc. up to an n'th pulse shaper element that expands the logic low pulse by $n'\tau$.

The outputs of the pulse shaper elements may be coupled to substantially identical divider circuits, such as divide by 2 circuits, whose outputs are coupled to a multiplexer. The multiplexer is used to select two inputs for output to a set of two master-slave configured flip-flops. One of the outputs of the divider circuits selected by the multiplexer is used as a clock signal to the flip-flops while the other of the two outputs selected by the multiplexer is used as the data signal to the flip-flops. The flip-flops sample the divider outputs selected by the multiplexer to detect if the dividers have failed or not. The outputs of the flip-flops are provided to an XOR gate which outputs a duty cycle signal indicative of the duty cycle of the input signal.

The circuitry of the illustrative embodiments exploits the properties of dividers at the point where the dividers fail. The dividers employ flip-flops which have built-in setup and hold time requirements. When the input signal pulse becomes comparable with the setup/hold time of the flip-flops, the divider fails. The duty cycle measurement circuit of the illustrative embodiments determines which of a plurality of dividers fail and uses this information to determine the duty cycle of the input signal.

For example, assume that the period of the input signal, e.g., an input clock signal CLK_IN, is $T_{clk\_in}$. The logic high pulse width of this input clock signal is referred to as $T_{high}$ and the logic low pulse width of this input clock signal is referred to as $T_{low}$. Therefore, the period of CLK_IN is equal to the sum of $T_{high}$ and $T_{low}$, i.e. $T_{clk_{in}} = T_{high} + T_{low}$. At the input to divider n, in the first path, the pulse width of the logic high pulse is stretched to $T_{high} + n\tau$. Similarly, at the input to divider n', in the second path, the pulse width of the logic low pulse is $T_{low} + n'\tau$. If the minimum pulse beyond which a divider fails is $P_{min}$, then when either of the conditions $(T_{high} + n\tau) + P_{min} = T_{clk\_in}$ or $(T_{low} + n'\tau) + P_{min} = T_{clk\_in}$ occur, the divider will fail.

If the duty cycle of the input signal, e.g., CLK_IN, is 50%, then $T_{high} = T_{low}$ and, since the dividers are substantially identical, n=n'. Therefore, for calibration purposes, a 50% duty cycle input signal is generated. This 50% duty cycle input signal may be generated, for example, by providing a divide by 2 circuit that operates on the input signal and which is selected by a multiplexer. A well designed divide by 2 circuit outputs a 50% duty cycle output signal regardless of the duty cycle of the input signal. The 50% duty cycle output signal generated in this manner is used to calibrate the duty cycle measurement circuit by determining any offset of the indices of the inputs to the multiplexer that provides the inputs to the set of master/slave flip-flops such that this offset may be used to normalize results from measurement of duty cycle.

In performing measurements of duty cycle, an input signal is provided to the plurality of pulse shaper elements which expand the pulse width for logic high pulses and logic low pulses of the input signal. Various ones of the outputs from the pulse shaper elements are selected and corresponding divider circuit outputs are analyzed to determine if the corresponding divider circuits fail. Based on this information, and indices associated with the pulse shaper elements or the divider circuits, the duty cycle of the input signal is determined. Calibration may be used to adjust the identification of indices to compensate for variations in wafer process gradients and/or poor design.

In one illustrative embodiment, a method is provided for determining a duty cycle of an input signal. The method may comprise receiving the input signal in a duty cycle measurement circuit having a plurality of dividers, determining if one or more of the plurality of dividers fail, determining a relationship of a duty cycle of the input signal to a 50% duty cycle based on the determined one or more of the plurality of dividers that fail, and calculating the duty cycle of the input signal based on the determined relationship and an index of the one or more of the plurality of dividers that fail. Receiving the input signal in the duty cycle measurement circuit may further comprise receiving the input signal as an input to a plurality of pulse shaper elements, wherein each pulse shaper element delays a pulse of the input signal by a predetermined delay amount $\tau$.

The plurality of pulse shaper elements may comprise a first input signal path in which a first set of pulse shaper elements are connected in series such that a first pulse shaper element in the first input path expands a logic high pulse of the input signal by $\tau$, a second pulse shaper element in the first input path expands the logic high pulse by $2\tau$, up to an nth pulse shaper element in the first input path that expands the logic high pulse by $n\tau$. Moreover, the plurality of pulse shaper elements may comprise a second input signal path in which a second set of pulse shaper elements are connected in series such that a first pulse shaper element in the second input path expands a logic low pulse of the input signal by $\tau$, a second pulse shaper element in the second input path expands the logic low pulse by $2\tau$, up to an n'th pulse shaper element in the second input path that expands the logic low pulse by $n'\tau$.

An output of each of the pulse shaper elements in the plurality of pulse shaper elements may be coupled to a divider in the plurality of dividers. An output of each of the dividers in the plurality of dividers may be coupled to a multiplexer. The multiplexer may select pairs of outputs from the plurality of dividers for use in determining if one or more of the plurality of dividers fail. Outputs from the multiplexer may be coupled to a pair of flip-flops whose outputs are coupled to a logic gate. The logic gate may output a signal indicative of whether one of the dividers in the plurality of dividers fail.

An output of each of the pulse shaper elements may be coupled to a multiplexer. The multiplexer may select pairs of outputs from the pulse shaper elements for use in determining if one or more of the plurality of dividers fail. The plurality of dividers may be coupled to outputs of the multiplexer, outputs of the plurality of dividers may be coupled to a pair of flip-flops whose outputs may be coupled to a logic gate. The logic gate may output a signal indicative of whether one of the dividers in the plurality of dividers fail.

Determining a relationship of a duty cycle of the input signal to a 50% duty cycle based on the determined one or more of the plurality of dividers that fail may comprise determining a first index of a first failed divider in the first input path identified as having failed, determining a second index of a first failed divider in the second input path identified as having failed, and determining a relationship of the duty cycle of the input signal to a 50% duty cycle based on the first index and the second index. Moreover, determining a relationship of the duty cycle of the input signal to a 50% duty cycle based on the first index and the second index may comprise determining if the first index is less than the second index, determining that the duty cycle of the input signal is greater than 50% if the first index is less than the second index, determining if the first index is greater than the second index, and determining that the duty cycle of the input signal is less than 50% if the first index is greater than the second index.

Calculating the duty cycle of the input signal based on the determined relationship and an index of the one or more of the plurality of dividers that fail may comprise calculating the duty cycle of the input signal using the following equation if the relationship of the duty cycle of the input signal to a 50% duty cycle is determined to be greater than the 50% duty cycle:

$$\text{Duty Cycle (in \%)} = 50\% * (n+i)/(n)$$

where n is a failure index for a divider in the first input path for a 50% duty cycle input signal, and n+i is the first index. Moreover, calculating the duty cycle of the input signal based on the determined relationship and an index of the one or more of the plurality of dividers that fail may comprise calculating the duty cycle of the input signal using the following equation if the relationship of the duty cycle of the input signal to a 50% duty cycle is determined to be less than the 50% duty cycle:

$$\text{Duty Cycle (in \%)} = 50\% * (n'-i)/(n')$$

where n' is a failure index for a divider in the second input path for a 50% duty cycle input signal, and n'-i is the second index.

In yet another illustrative embodiment, a duty cycle measurement apparatus is provided. The duty cycle measurement apparatus may comprise a plurality of pulse shaper elements, a multiplexer coupled to the plurality of pulse shaper elements, a plurality of dividers coupled to the multiplexer, and a controller coupled to the multiplexer. The plurality of pulse shaper elements may receive an input signal and shape a pulse of the input signal by introducing a predetermined delay $\tau$. The multiplexer, based on control signals from the controller, may select pairs of outputs from one of the plurality of pulse shaper elements or the plurality of dividers for use in determining if one or more of the plurality of dividers fail. The controller may determine a relationship of a duty cycle of the input signal to a 50% duty cycle based on the determined one or more of the plurality of dividers that fail. The controller may calculate a duty cycle of the input signal based on the determined relationship and an index of the one or more of the plurality of dividers that fail.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide an apparatus and methodology for determining the duty cycle of an input signal. While the disclosed apparatus is especially useful for measurements in the Gigahertz range, i.e. approximately 1 GHz and above, it may also measure the duty cycle of lower frequency digital signals.

In the illustrative embodiments, the disclosed apparatus and methodology employ characteristics of a failed divider circuit, at the frequency where the divider circuit fails, to determine the duty cycle of an input signal, such as a clock signal. While the illustrative embodiments will be described with reference to determining the duty cycle of a clock signal output, it should be appreciated that this is only exemplary and is not intended to state or imply any limitation with regard to the types of signals or signal sources upon which the mechanisms of the illustrative embodiments may be applied. To the contrary, the mechanisms of the illustrative embodiments may be applied to any signal from any signal source so as to determine the duty cycle of that signal.

The duty cycle measurement (DCM) circuit or apparatus of the illustrative embodiments employ dividers to determine the duty cycle of an input signal. In particular, the divider is comprised of one or more flip-flops which have a built-in set up and hold time requirement. Thus, when the input signal pulse, e.g., clock pulse, becomes comparable with the setup/hold time of the latches, the divider fails. The point at which this failure occurs provides information about the duty cycle of the input signal pulse which can be extracted by the mechanisms of the illustrative embodiments.

Figure 1:
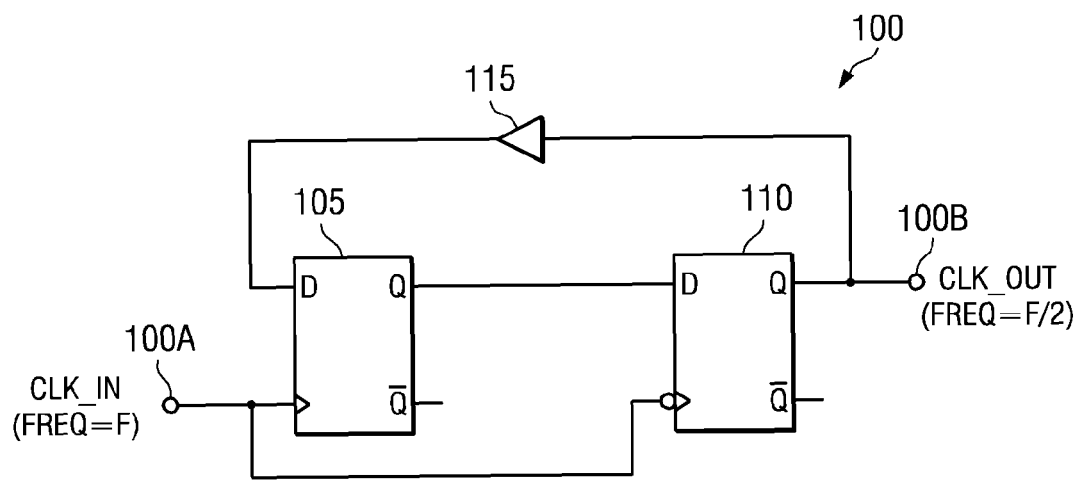
FIG. 1 is an exemplary diagram illustrating a divider circuit that a duty cycle measurement (DCM) apparatus according to the illustrative embodiments may employ.

FIG. 1 shows a representative divider circuit 100, which may be coupled to a DCC circuit in accordance with the illustrative embodiments as discussed hereafter. The divider circuit 100 includes an input 100A and an output 100B. Divider circuit 100 receives a digital signal exhibiting a predetermined frequency at its input 100A and provides a divided-down version of that digital signal at output 100B. Divider circuit 100 includes latches 105 and 110. The clock input of latch 105 couples to divider input 100A to receive a clock signal, CLK_IN, exhibiting a frequency F. The clock input of latch 105 couples to the clock input of latch 110 such that each latch clock input receives the same CLK_IN signal. The Q output of latch 105 couples to the D input of latch 110. The Q output of latch 110 couples via inverter 115 to the D input of latch 105. The Q output of latch 110 also couples to output 100B of divider circuit 100.

In this configuration, divider circuit 100 provides an output signal, CLK_OUT, at divider output 100B that exhibits a frequency, F/2, namely one half the frequency of the CLK_IN signal at input 100A. Latches 105 and 110 have a setup and hold requirement, namely a predetermined amount of time that a clock pulse must remain on the clock input of a latch to enable the latch to latch data at the latch's D input. If the CLK_IN signal that divider circuit 100 receives violates the setup and hold requirement, then divider circuit 100 fails. When divider circuit 100 fails, the CLK_OUT signal that divider circuit 100 produces is not equal to a divided down signal, but rather some other waveform. The illustrative embodiments utilize this point of failure of the divider as a way of determining the duty cycle of the input signal.

Figure 2A:
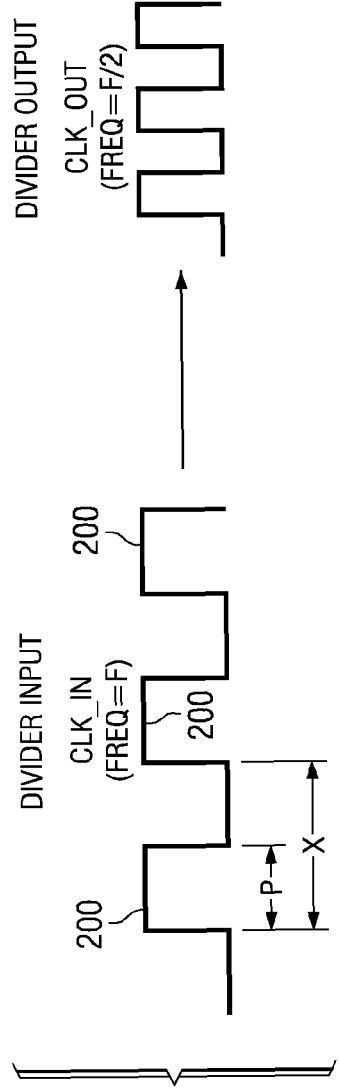
FIGS. 2A-2C are exemplary diagrams illustrating divider input and divider output signals under different operating conditions in accordance with one illustrative embodiment.

FIG. 2A shows the CLK_IN signal prior to divider action. FIG. 2A also shows the CLK_OUT signal after divider action, namely the divided-down version of the clock signal. In this particular example, the divider circuit successfully divided the CLK_IN signal to form the CLK_OUT signal as seen by inspection of the CLK_OUT waveform in FIG. 2A. When the divider circuit successfully conducts its division operation, the resultant CLK_OUT waveform is in synchronization with the CLK_IN signal at the input of the divider.

In the case depicted in FIG. 2A, where the divider circuit is successful, the duration P of pulse 200 is not so long or short as to cause the divider circuit to fail. However, at some frequencies, the duration P of pulse 200 becomes so long or short that the pulse waveform violates the setup and hold threshold time, $T_{S/H}$, of the divider circuit. In response, the divider circuit fails to divide.

Figure 2B:
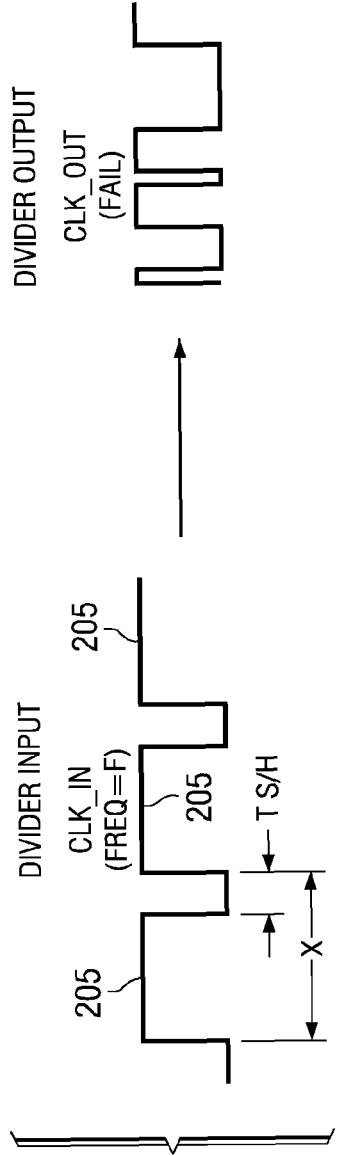

For example, as seen in FIG. 2B, when the pulses 205 become so long in duration that the time between pulses 205 is equal to or less than $T_{S/H}$, then the divider circuit fails. In other words, the resultant output signal of the divider circuit, namely CLK_OUT, is not a divided down version of CLK_IN, but rather is a corrupt version thereof. The lack of synchronism between the CLK_OUT signal and the CLK_IN signal provides an indicator that the divider circuit failed for this particular CLK_IN waveform.

Figure 2C:
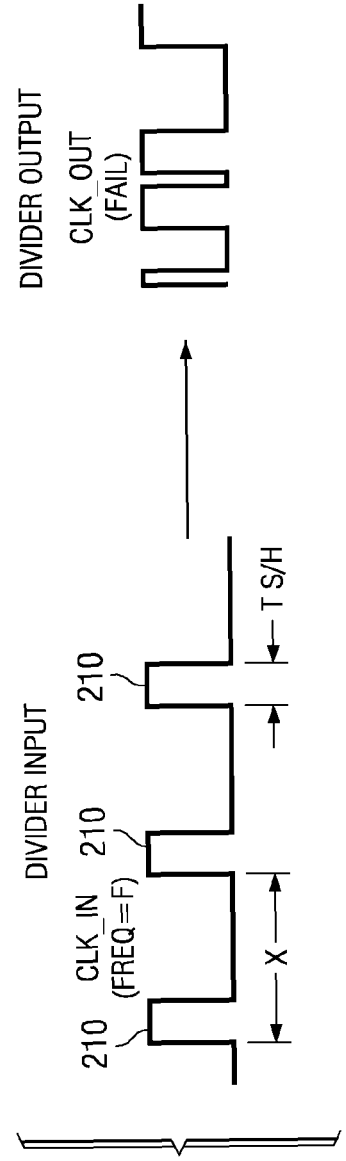

In a similar manner, at some frequencies the duration P of pulse 200 becomes so short that it violates the setup and hold threshold time, $T_{S/H}$, of the divider circuit. In response, the divider circuit fails to divide. For example, as seen in FIG. 2C, when the pulses 210 become equal to or less than $T_{S/H}$ in duration, then the divider circuit fails. In other words, the resultant output signal of the divider circuit, namely CLK_OUT, is not a divided down version of CLK_IN, but rather is a corrupt version thereof. Again, the lack of synchronism between the CLK_OUT signal and the CLK_IN signal provides an indicator that the divider circuit failed for this particular CLK_IN waveform.

Figure 3:
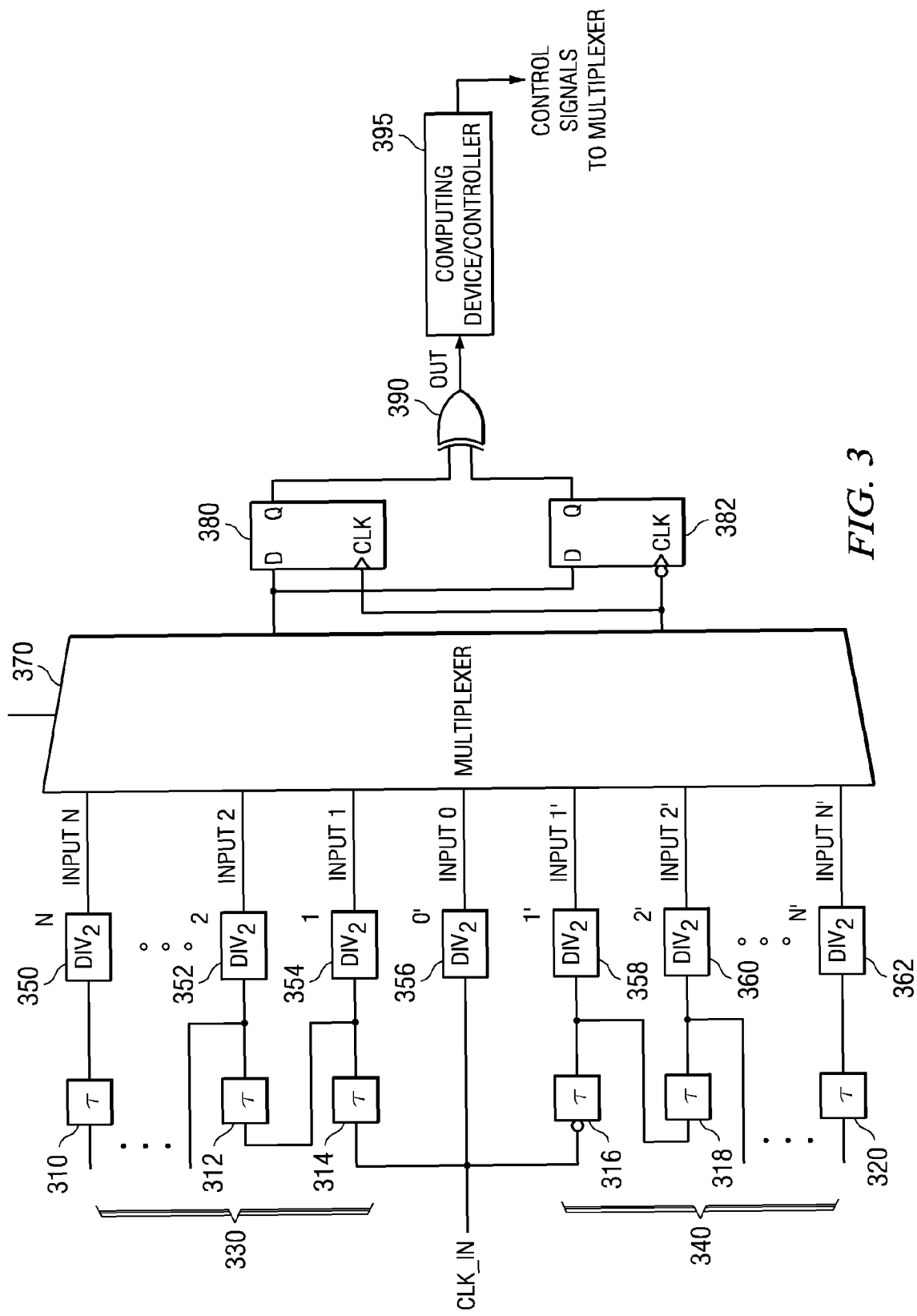
FIG. 3 is an exemplary diagram illustrating a DCM apparatus in accordance with one illustrative embodiment.

FIG. 3 is an exemplary diagram illustrating a duty cycle measurement (DCM) apparatus in accordance with one illustrative embodiment. As shown in FIG. 3, the DCM apparatus comprises a plurality of substantially identical pulse shaper elements 310-320, each of which expand the pulse of an input signal, e.g., a clock signal CLK_IN, whose duty cycle is to be measured, by a same amount τ. The inputs to these pulse shaper elements 310-314 are connected in series along a first path 330 such that a first pulse shaper element 314 expands the logic high pulse by τ, a second pulse shaper element 312 expands the logic high pulse by 2τ, a third pulse shaper element 310 expands the logic high pulse by 3τ, etc. up to an nth pulse shaper element that expands the logic high pulse by nτ. Similarly, along a second path 340 in which the input signal CLK_IN is inverted, the inputs to the pulse shaper elements 316-320 are connected in series such that a fourth pulse shaper element 316 expands a logic low pulse by τ, a fifth pulse shaper element 318 expands the logic low pulse by 2τ, a third pulse shaper element 320 expands the logic low pulse by 3τ, etc. up to an n'th pulse shaper element that expands the logic low pulse by n'τ.

The outputs of the pulse shaper elements 310-320 may be coupled to substantially identical divider circuits 350-362, such as divide by 2 circuits, whose outputs are coupled to a multiplexer 370. The multiplexer 370 is used to select two inputs for output to a set of two master/slave configured flip-flops 380-382. One of the outputs of the divider circuits 350-362 selected by the multiplexer 370 is used as a clock signal to the flip-flops 380-382 while the other of the two outputs selected by the multiplexer 370 is used as the data signal to the flip-flops 380-382.

In the flip-flops 380-382, the clock signal must lead the data signal in order to ensure that sampling of the data signal takes place away from data edges. For the highest measurement resolution, adjacent divider circuit 350-362 outputs are used for clock and data inputs to the flip-flops 380-382. For example, the output of a divider circuit n may be used for the clock input to the flip-flops 380-382, and the output of divider circuit n+1 may be used for the data input to the flip-flops 380-382. In the depicted example, the highest resolution of duty cycle measurement is +/−τ seconds. The resolution can be relaxed by using non-adjacent divider circuit 350-362 outputs as the clock and data inputs to the flip-flops 380-382.

The flip-flops 380-382 sample the divider circuit 350-362 outputs selected by the multiplexer 370 to detect if the divider circuits 350-362 have failed or not. The outputs of the flip-flops 380-382 are provided to an XOR gate 390 which outputs a duty cycle signal indicative of the duty cycle of the input signal.

The circuitry of the illustrative embodiments exploits the properties of dividers at the point where the dividers fail. The divider circuits 350-362 employ flip-flops which have built-in setup and hold time requirements. When the input signal pulse, whose pulse width is expanded by the pulse shaper elements 310-320, becomes comparable with the setup/hold time of the flip-flops, the divider circuit fails. The duty cycle measurement circuit of the illustrative embodiments determines which of a plurality of dividers circuits fail, by selecting pairs of outputs and providing them to the flip-flops 380-382, and uses this information to determine the duty cycle of the input signal CLK_IN.

For example, assume that the period of the input signal, e.g., an input clock signal CLK_IN, is $T_{clk\_in}$. The logic high pulse width of this input clock signal is referred to as $T_{high}$ and the logic low pulse width of this input clock signal is referred to as $T_{low}$. Therefore, the period of CLK_IN is equal to the sum of $T_{high}$ and $T_{low}$:

$$T_{clk\_in} = T_{high} + T_{low} \quad (1)$$

At the input to divider n, in the first path, the pulse width of the logic high pulse is stretched to $T_{high}+n\tau$. Similarly, at the input to divider n', in the second path, the pulse width of the logic low pulse is $T_{low}+n'\tau$. If the minimum pulse beyond which a divider fails is $P_{min}$, then when either of the conditions:

$$(T_{high}+n\tau)+P_{min}=T_{clk\_in} \quad (2)$$

$$(T_{low}+n'\tau)+P_{min}=T_{clk\_in} \quad (3)$$

occur, the divider will fail.

If the duty cycle of the input signal, e.g., CLK_IN, is 50%, then $T_{high}=T_{low}$ and, since the dividers are substantially identical, n=n'. Therefore, for calibration purposes, a 50% duty cycle input signal is generated. This 50% duty cycle input signal may be generated, for example, by providing a divide by 2 circuit that operates on the input signal and which is selected by a multiplexer. A well designed divide by 2 circuit outputs a 50% duty cycle output signal regardless of the duty cycle of the input signal. The 50% duty cycle output signal generated in this manner is used to calibrate the duty cycle measurement circuit by determining any offset of the indices of the inputs to the multiplexer that provides the inputs to the set of master/slave flip-flops such that this offset may be used to normalize results from measurement of duty cycle.

In performing measurements of duty cycle, an input signal, such as the CLK_IN signal, is provided to the plurality of pulse shaper elements 310-320 which expand the pulse width for logic high pulses and logic low pulses of the input signal CLK_IN. Various ones of the outputs from the pulse shaper elements 310-320 are selected and corresponding divider circuit 350-362 outputs are analyzed to determine if the corresponding divider circuits 350-362 fail. Based on this information, and indices n and n' associated with the pulse shaper elements 310-320 or the divider circuits 350-362, the duty cycle of the input signal CLK_IN is determined. Calibration may be used to adjust the identification of indices n and n' to compensate for variations in wafer process gradients and/or poor design.

For example, the CLK_IN input is provided to the pulse shaper elements 310-320 and divider circuits 350-362 which generate outputs to the multiplexer 370. The multiplexer 370 sweeps through the various divider settings, i.e. the various inputs from the divider circuits 350-362, providing one input from a first divider circuit as a clocking signal to the flip-flops 380-382 and a second input from a second divider circuit as a data signal to the flip-flops 380-382. In a preferred illustrative embodiment, adjacent inputs from divider circuits 350-362 are selected as inputs to the flip-flops 380-382 with the smaller pulse width being provided as the clock signal to the flip-flops 380-382. For example, if input from divider circuit 354 and divider circuit 352 are selected by the multiplexer 370, then the input from divider circuit 354 is provided to the flip-flops 380-382 as the clock input signal, and the input from the divider circuit 352 is provided to the flip-flops 380-382 as the data input signal.

As discussed above, the flip-flops 380-382 determine which divider circuits have failed. In order to understand how this detection is performed, it should be appreciated that the selected clock input signal to the flip-flops 380-382 is always ahead of the selected data input signal (this is shown, for example, in FIG. 4A discussed hereafter). Furthermore, the data input signal fails before the clock input signal fails due to the fact that the data input signal passes through at least one extra delay stage τ. Thus, there are two cases to consider, i.e. a first case where the divider circuit, e.g., divider circuit 352, has failed and a second case where the divider circuit 352 has not failed.

Figure 4A:
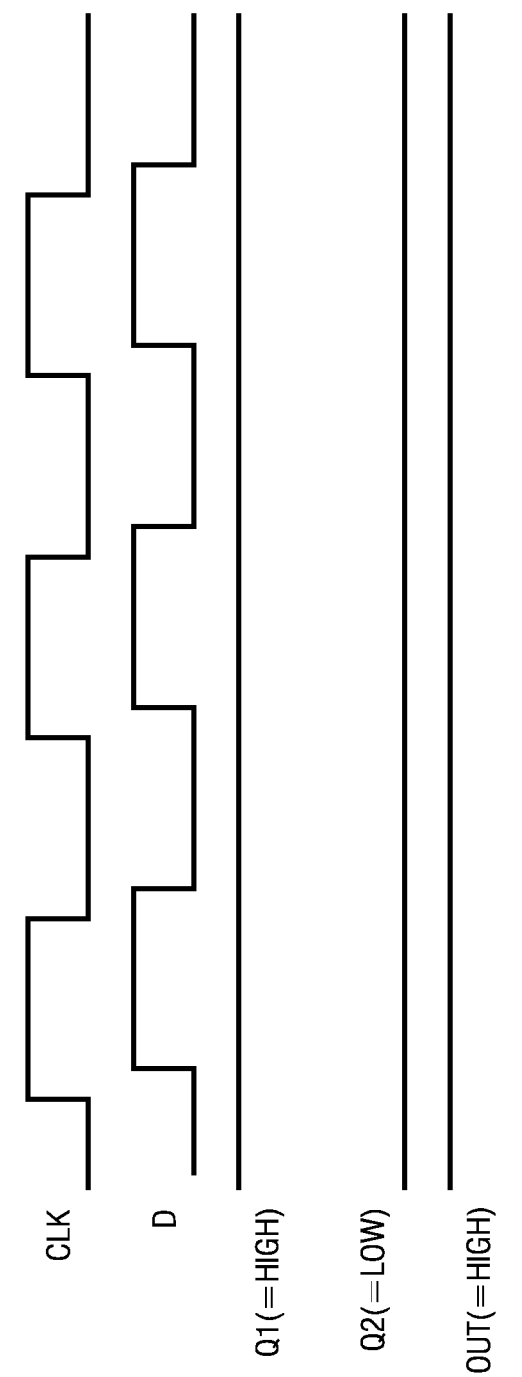
FIGS. 4A and 4B are exemplary timing diagrams showing the output from the master/slave flip-flops and the XOR gate for a case in which both selected dividers are functional, and for a case in which one of the selected dividers is not functional, in accordance with one illustrative embodiment.
Figure 4B:
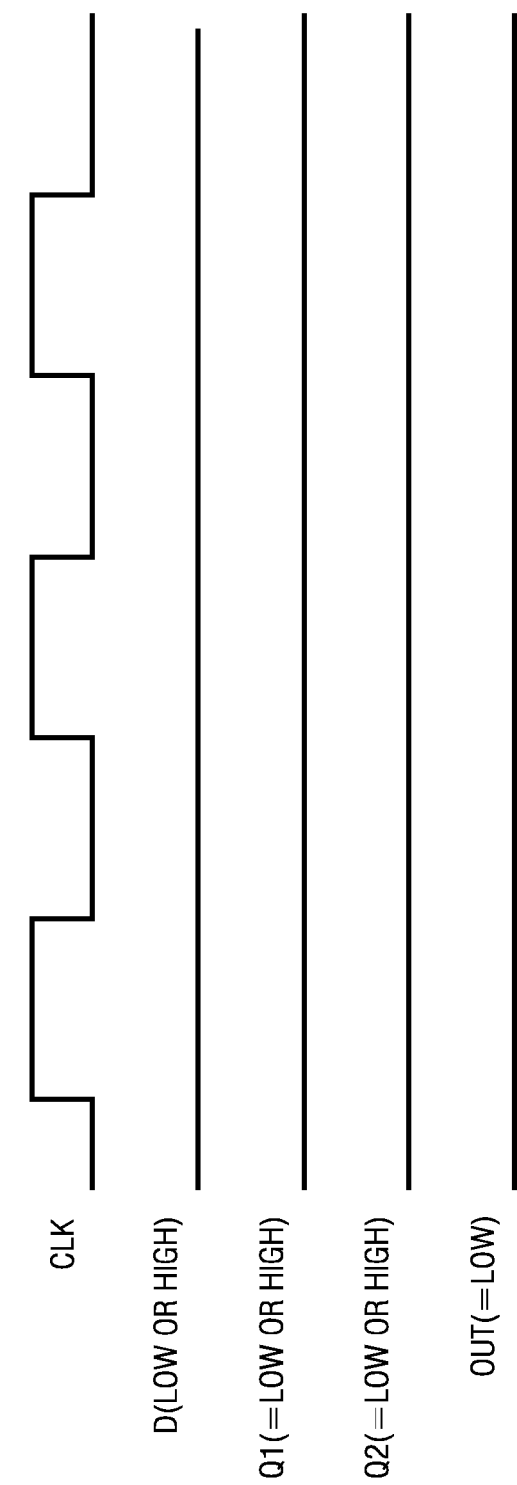

In the first case, at the point where the divider circuit 352 has failed, the data input signal is flat (either high or low) while the clock input signal is toggling properly (this is shown, for example, in FIG. 4B discussed hereafter). With reference to FIG. 4A, the flip-flop 380 samples the data input signal on a rising edge of the clock input signal and the flip-flop 382 samples the data input signal on the falling edge of the clock input signal. Since the data input signal is not changing, the outputs of flip-flops 380 and 382 will be identical. When these outputs are passed through the XOR gate 390, the XOR gate's output is low indicating a failed divider circuit 352.

In the second case, both the clock input signal and the data input signal are toggling properly (such as is shown, for example, in FIG. 4A). Again, it should be noted that during this normal operational case, the clock input signal is always ahead of the data input signal. Since the flip-flop 380 samples the data input signal on a rising edge of the clock input signal, and the flip-flop 382 samples the data input signal on a falling edge of the clock input signal, the outputs of the two flip-flops 380-382 will always be of opposite polarity. As a result, the outputs of the flip-flops 380-382 will cause the output of the XOR gate 390 to be high, indicating that the divider circuit 352 is operating properly.

If the input signal CLK_IN has a duty cycle that is 50%, then the indices n and n' where the dividers first fail will be identical, i.e. n=n', assuming no additional calibration is needed. If the CLK_IN signal has a duty cycle that is greater than 50%, then the first failing indices will be greater than n' and less than n. To illustrate this, assume that there are "x" number of divider circuits in a positive direction (i.e. the high pulse being stretched) and "y" number of divider circuits in a negative direction (i.e. the low pulse being stretched). If x is equal to y, and a 50% duty cycle clock input signal is input, the point of failure in the positive direction is n, where n is less than x. This means that all divider circuits from n+1 to x fail while those below n are still operational. If the point of failure in the negative direction is n', and n' is less than y, then all dividers from n'+1 to y fail while those below n' are still operational.

Since the input clock signal has a 50% duty cycle, for calibration purposes, i.e. no further calibration is necessary, then n=n'. If an arbitrary clock input signal is input to the circuit, having a same frequency as the calibration clock signal, but with a duty cycle greater than 50%, then one might find a divider circuit failure to occur at some n+i index, where n and n' are the failure index for a 50% duty cycle input signal. The n+i index is found by sweeping the multiplexer through all of the divider circuit outputs until the first failure is discovered. Since the input clock signal duty cycle is greater than 50%, i is positive. For this clock input signal, when the sweep is done in the negative direction, the failing index is at n'−i=n−i. Thus, the duty cycle of the CLK_IN signal can then be computed as:

Duty Cycle (in %)=[50%*(n+i)/(n)]     (4)

If the CLK_IN signal has a duty cycle that is less than 50%, then the first failing indices will be greater than n and less than n'. In this case, the duty cycle of the CLK_IN signal may be computed as:

Duty Cycle (in %)=[50%*(n'−i)/(n')]     (5)

The output of the XOR gate 390 in the DCM apparatus shown in FIG. 3 may be provided to a computing device or controller 395 which maintains a listing of the divider circuits 350-362 that are determined to have failed through operation of the DCM apparatus. The computing device or controller 395 may determine the first failing divider circuit 350-362, i.e. the divider circuit having the lowest index from 0 to n and from 0 to n', if any. This information may be used to compare against the n and n' values to determine whether the duty cycle is 50%, greater than 50%, or less than 50%. That is, if the first failed divider index is less than n and greater than n', then the duty cycle is greater than 50%. If the first failed divider index is greater than n and less than n', then the duty cycle is less than 50%. The corresponding equation may then be used to determine the actual duty cycle of the input signal CLK_IN.

For example, if n and n' are 3, and a first failed divider in a positive path, i.e. the path in which the logic high pulse is expanded by the pulse shaper elements, is determined to be 2, and a first failed divider in a negative path, i.e. the path in which the logic low pulse is expanded by the pulse shaper elements, is determined to be 4, then it is determined that the duty cycle is greater than 50%. As a result, i is determined to be 1. Hence the duty cycle, determined using equation (4) above, is [50%*(3+1)/(3)]=67%. Similarly, if the first failed divider in the positive path is determined to be 4, and the first failed divider in the negative path is 2, then it is determined that the duty cycle is less than 50%. As a result, i is determined to be 1 (3−2). Hence the duty cycle, determined using equation (5) above, is [50%*(3−1)/3]=33.33%.

FIGS. 4A and 4B provide representative timing diagrams showing the output from the flip-flops 380-382 and the XOR gate 390 for a case in which both selected dividers are functional, and for a case in which one of the selected dividers is not functional. For example, in FIG. 4A, both divider n (used to provide the clock signal) and divider n+1 (used to provide the data signal) are functional. In that case, the output OUT of the XOR gate is at a logic high state indicating that both dividers are functional. In FIG. 4B, divider n is functional, but divider n+1 is failing. In this case, the output OUT of the XOR gate is at a logic low state indicating a failing divider, i.e. divider n+1. By identifying the divider n+1 in this way, the first failing divider index may be determined and used by the controller or computing system to calculate the duty cycle as discussed above.

It should be noted that there may be variations in the circuit due to poor design, wafer process gradients, and the like. These variations may cause the DCM apparatus of the illustrative embodiments to not operate in a perfectly calibrated manner in which no further calibration is necessary. As a result, it may be necessary to provide a calibration circuit for calibrating the DCM apparatus in accordance with a 50% duty cycle input signal, as previously discussed above. The illustrative embodiments utilize the input signal, e.g., CLK_IN, and a divide by 2 circuit to generate such a 50% duty cycle calibration input signal. The divide by 2 circuit provides a 50% duty cycle output signal regardless of the duty cycle of the input signal to the divide by 2 circuit.

Figure 5A:
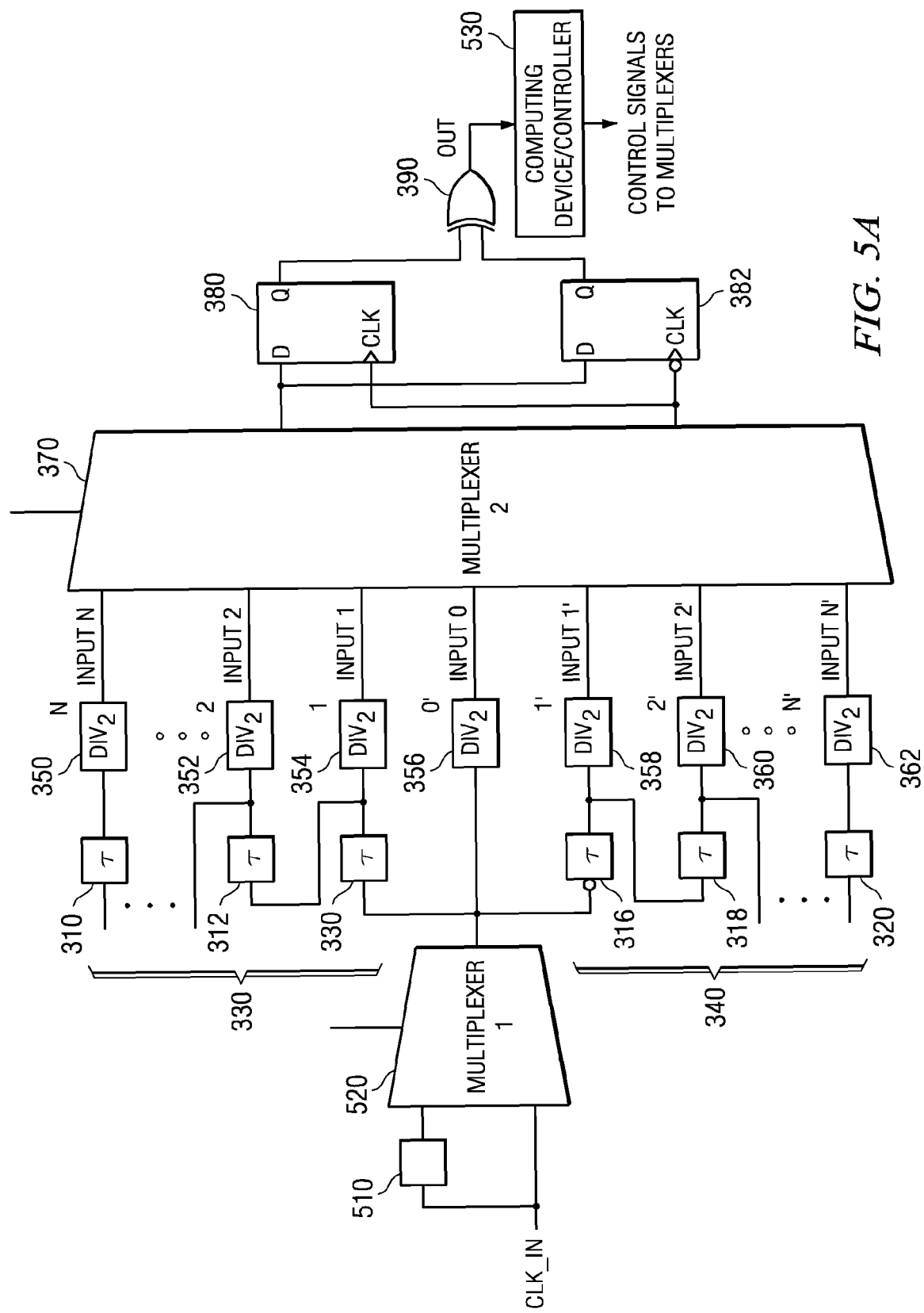
FIG. 5A is an exemplary diagram illustrating a DCM apparatus in which a calibration circuit is provided for calibrating the operation of the DCM apparatus in accordance with one illustrative embodiment.

FIG. 5A is an exemplary diagram illustrating a DCM apparatus in which a calibration circuit is provided in accordance with one illustrative embodiment. As shown in FIG. 5A, the DCM apparatus is essentially the same as that shown in FIG. 3 above with the addition of a calibration circuit 510 and a multiplexer 520. The calibration circuit 510 operates on the input signal CLK_IN to generate a 50% duty cycle input signal to the multiplexer 520. The multiplexer 520 selects one of the calibration input signal, i.e. the 50% duty cycle signal generated by the calibration circuit 510, or the input signal CLK_IN for output to the pulse shaper elements 310-320 and dividers 350-362.

In operation, in order to calibrate the DCM apparatus, the multiplexer 520, in response to control signals from the computing device/controller 530, selects the output from the calibration circuit 510. The multiplexer 370, in response to control signals from the computing device/controller 530, sweeps through the various divider 350-362 outputs. The output of the XOR gate 390 is used to determine which dividers 350-362 have failed. Since the output clock from the calibration circuit 510 has a 50% duty cycle, assuming a good design and negligible device mismatches, the indices at which the dividers 350-362 first fail will be symmetric, i.e. n=n'. If this is not the case, then an offset is determined. This offset may be used to normalize the results from measurement of the duty cycle of input signals. The offset information may be stored in the controller or computing device for use in determining the duty cycle of input signals during measurement operations, as discussed above.

For example, if there is no offset, then during calibration, n=n'. If there is an offset, then n=n'+n_offset. In equations 4 and 5 above, it has been assumed that n=n'. If there is an offset, then n is changed to n'+n_offset in the above equations, i.e. n'+n_offset is the new "n" measured from calibration measurements.

Figure 5B:
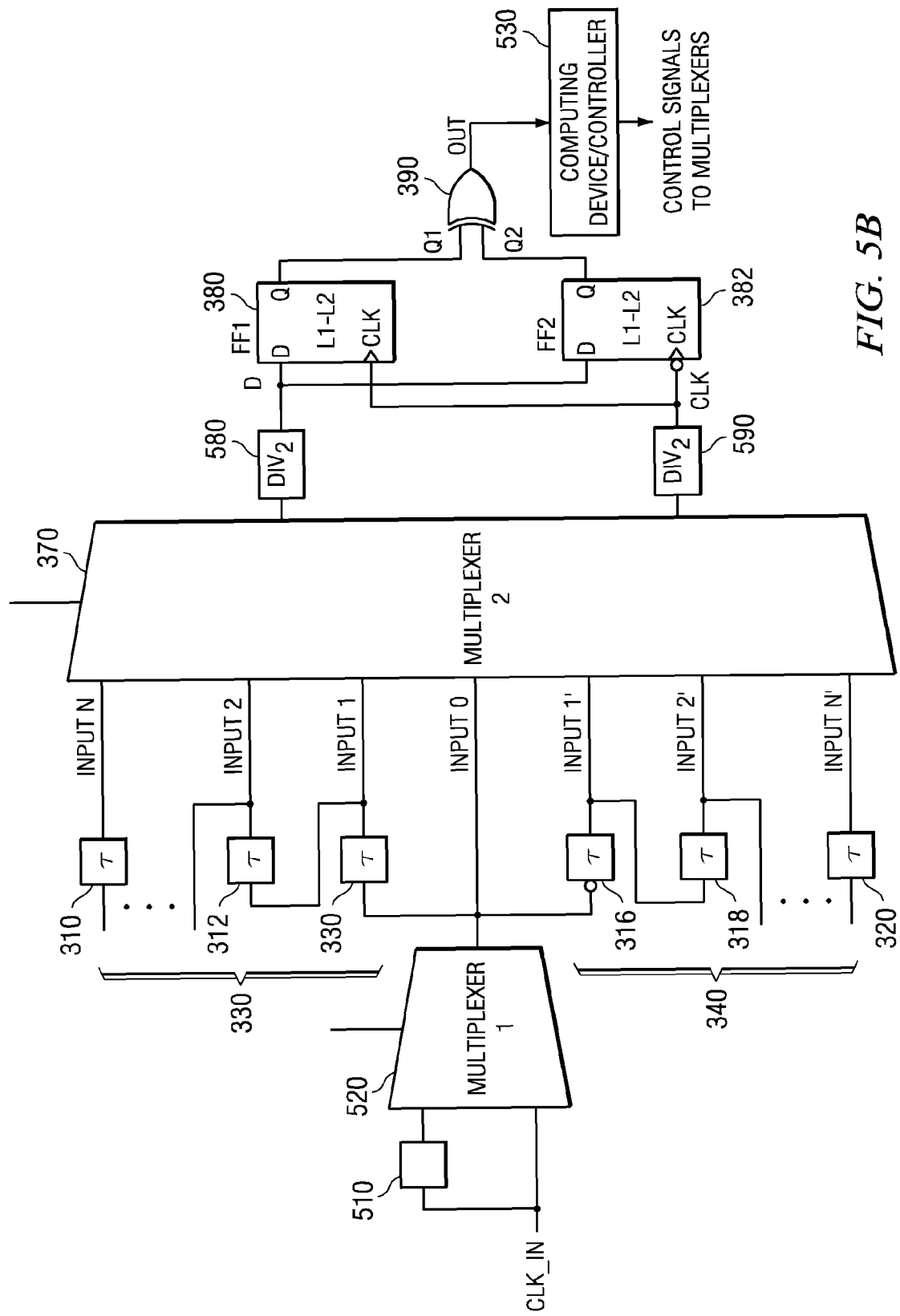
FIG. 5B is an exemplary diagram illustrating a DCM apparatus in accordance with an alternative illustrative embodiment.

FIG. 5B is an exemplary diagram illustrating a DCM apparatus in which a calibration circuit is provided in accordance with an alternative illustrative embodiment. The primary difference between the DCM apparatus of FIG. 5B and that of FIG. 5A is that the number of divider circuits is drastically reduced. That is, rather than each input to the multiplexer 370 being from a divider circuit 350-362, as in FIG. 5A, two divider circuits 580 and 590 are provided on the outputs of multiplexer 370. The operation of the circuit shown in FIG. 5B is essentially the same as the circuit shown in FIG. 5C with the primary difference being that the divide operations are moved to a position after the multiplexer 370. In doing so, area and power may be saved.

In the various DCM apparatus configurations described above, the resolution of the DCM apparatus is limited by the resolution of the pulse shaper circuits. The duty cycle resolution may be quantified as:

$$DC \text{ Measurement Resolution (in \%)} = (+/-\tau/T)*100 \quad (6)$$

where τ is the smallest pulse shaping correction available by the pulse shapers and T is the period of the input signal, e.g., CLK_IN. This implies there are T/τ indices present in the DCM apparatus.

Figure 6:
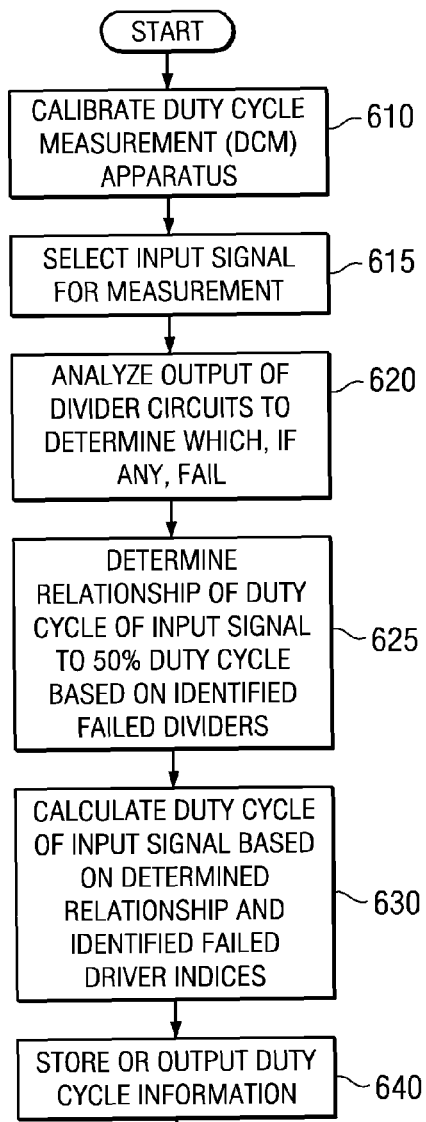
FIG. 6 is a flowchart outlining an exemplary operation for characterizing the duty cycle of an input signal in accordance with one illustrative embodiment.

FIG. 6 is a flowchart outlining an exemplary operation for characterizing the duty cycle of an input signal in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 6, the operation starts with calibrating the DCM apparatus by generating a 50% duty cycle input signal and measuring any offsets (step 610). Thereafter, the input signal is selected (step 615). Divider circuits associated with pulse shaper elements are analyzed to determine which divider circuits, if any, fail (step 620). Based on the identification of the divider circuits that fail, a determination of a relationship of the duty cycle of the input signal to a 50% duty cycle is made (step 625). Based on the determined relationship, the actual duty cycle of the input signal is calculated based on an index value of the first failed divider circuit (step 630). This duty cycle information may then be stored or output for use in verifying proper operation and design of the integrated circuit device in which the DCM apparatus is provided (step 640). The operation then terminates.

It should be appreciated that the DCM apparatus of the illustrative embodiments may be used anywhere on an integrated circuit device to measure the duty cycle of an input signal. In fact, the DCM apparatus may be scattered through the integrated circuit device to measure duty cycle locally. The DCM apparatus provides excellent resolution that may be less than approximately 5 picoseconds (ps). No off-chip calibration is required by the DCM apparatus since calibration can be carried out using the signal whose duty cycle is to be measured. Moreover, all inputs (other than the input signal to be measured) and output are duty cycle signals. This greatly relaxes bandwidth requirements for test purposes. This makes the DCM apparatus suitable for a wide variety of applications.

Figure 7:
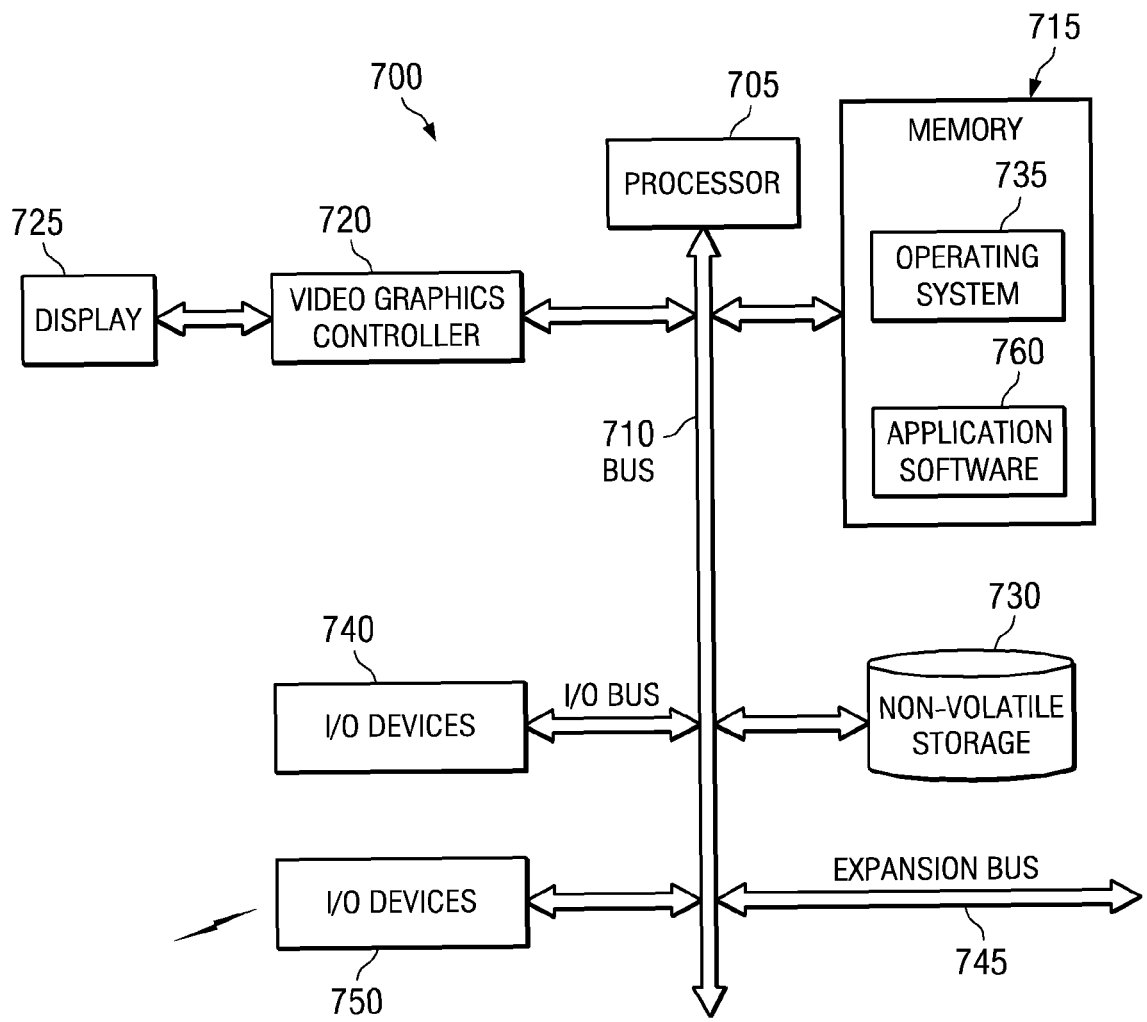
FIG. 7 is an exemplary diagram of an information handling system (IHS) in which the exemplary aspects of the illustrative embodiments may be implemented.

FIG. 7 shows an information handling system (IHS) 700 that employs integrated circuit in which the DCM apparatus of FIG. 3, FIG. 5A, or FIG. 5B, may be provided as part of a processor 705 for the IHS. In this example, processor 705 includes the functional blocks (not shown) typically associated with a processor such as an instruction decoder, execution units, load/store units as well as other functional units. The computing device/controller (not shown in FIG. 7) may be coupled to the integrated circuit processor 705 to perform the duty cycle measurements described above using the DCM apparatus which may be provided in one or more locations of the processor 705.

IHS 700 further includes a bus 710 that couples processor 705 to system memory 715 and video graphics controller 720. A display 725 couples to video graphics controller 720. Nonvolatile storage 730, such as a hard disk drive, CD drive, DVD drive, or other nonvolatile storage couples to bus 710 to provide IHS 700 with permanent storage of information. An operating system 735 loads in memory 715 to govern the operation of IHS 700 such as running of application software 760. I/O devices 740, such as a keyboard and a mouse pointing device, are coupled to bus 710. One or more expansion busses 745, such as USB, IEEE 1394 bus, ATA, SATA, PCI, PCIE and other busses, are also coupled to bus 710 to facilitate the connection of peripherals and devices to IHS 700. A network adapter, which may be considered one of the I/O devices 750, may be coupled to bus 710 to enable IHS 700 to connect by wire or wireless link to a network and/or other information handling systems.

While FIG. 7 shows one IHS 700 that employs processor 705, the IHS 700 may take many other forms. For example, IHS 700 may take the form of a desktop, server, portable, laptop, notebook, or other form factor computer or data processing system. IHS 700 may take other form factors such as a gaming device, a personal digital assistant (PDA), a portable telephone device, a communication device or other devices that include a processor and memory. While IHS 700 of FIG. 7 is described as an information handling system, computing device/controller 395 of FIG. 3 is itself a form of information handling system.

Figure 8:
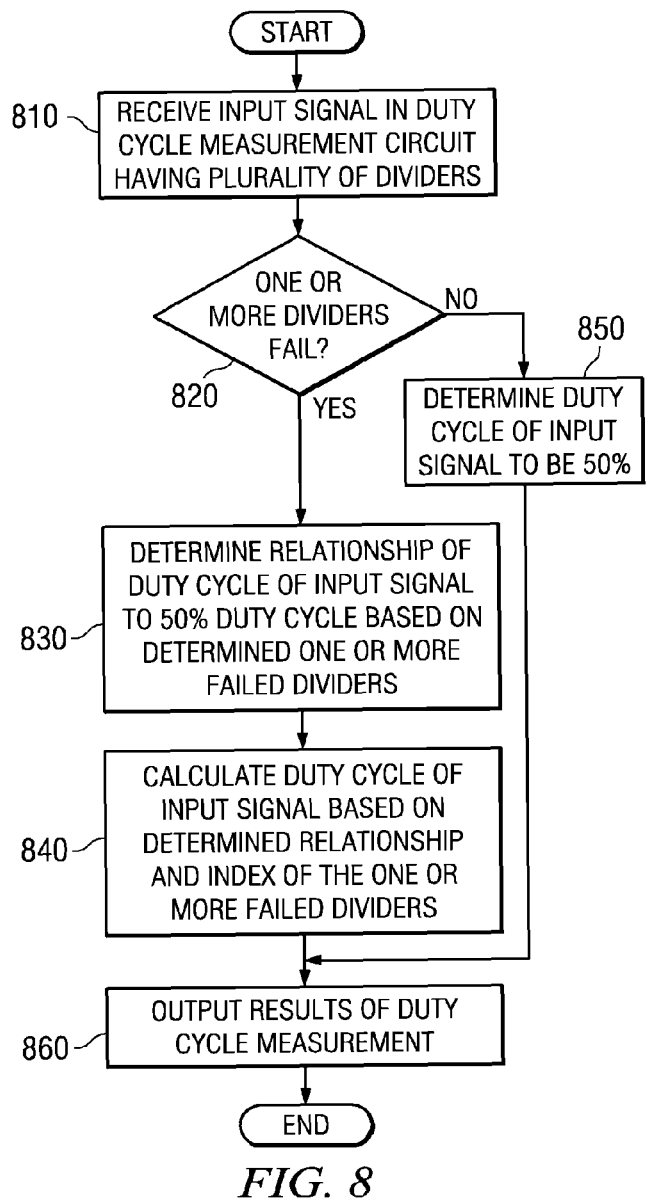
FIG. 8 is a flowchart outlining an exemplary operation for calculating a duty cycle of an input signal in accordance with one illustrative embodiment.

FIG. 8 is a flowchart outlining an exemplary operation for performing a duty cycle measurement operation in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 8, the operation starts with an input signal being received in a duty cycle measurement circuit of the illustrative embodiments (step 810). The duty cycle measurement circuit, in one illustrative embodiment, comprises a plurality of dividers.

The input signal may be received as an input to a plurality of pulse shaper elements. Each pulse shaper element may delay a pulse of the input signal by a predetermined delay amount $\tau$. The plurality of pulse shaper elements may include a first input signal path in which a first set of pulse shaper elements are connected in series such that a first pulse shaper element in the first input path expands a logic high pulse of the input signal by $\tau$, a second pulse shaper element in the first input path that expands the logic high pulse by $2\tau$, up to an nth pulse shaper element in the first input path that expands the logic high pulse by $n\tau$. The plurality of pulse shaper elements may include a second input signal path in which a second set of pulse shaper elements are connected in series such that a first pulse shaper element in the second input path expands a logic low pulse of the input signal by $\tau$, a second pulse shaper element in the second input path expands the logic low pulse by $2\tau$, up to an n'th pulse shaper element in the second input path that expands the logic low pulse by n't.

A determination is made as to whether one or more of the plurality of dividers fail (step 820). For example, an output of each of the pulse shaper elements in the plurality of pulse shaper elements may be coupled to a divider in the plurality of dividers of the measurement circuit. An output of each of the dividers in the plurality of dividers may be coupled to a multiplexer. The multiplexer may select pairs of outputs from the plurality of dividers for use in determining if one or more of the plurality of dividers fail. Outputs from the multiplexer may be coupled to a pair of flip-flops whose outputs are coupled to a logic gate. The logic gate may output a signal indicative of whether one of the dividers in the plurality of dividers fail.

A relationship of a duty cycle of the input signal to a 50% duty cycle is determined based on the determined failed dividers (step 830). Determining a relationship of a duty cycle of the input signal to a 50% duty cycle based on the determined one or more of the plurality of dividers that fail may include determining a first index of a first failed divider in the first input path identified as having failed, determining a second index of a first failed divider in the second input path identified as having failed, and determining a relationship of the duty cycle of the input signal to a 50% duty cycle based on the first index and the second index. Moreover, determining a relationship of the duty cycle of the input signal to a 50% duty cycle based on the first index and the second index may include determining if the first index is less than the second index, determining that the duty cycle of the input signal is greater than 50% if the first index is less than the second index, determining if the first index is greater than the second index, and determining that the duty cycle of the input signal is less than 50% if the first index is greater than the second index.

The duty cycle of the input signal is then calculated based on the determined relationship and an index of the one or more of the plurality of dividers that failed (step 840). Calculating the duty cycle of the input signal based on the determined relationship and an index of the one or more of the plurality of dividers that fail may include calculating the duty cycle of the input signal using the following equation if the relationship of the duty cycle of the input signal to a 50% duty cycle is determined to be greater than the 50% duty cycle:

$$\text{Duty Cycle (in \%)} = 50\% * (n+i)/(n)$$

where n is a failure index for a divider in the first input path for a 50% duty cycle input signal, and n+i is the first index. Moreover, calculating the duty cycle of the input signal based on the determined relationship and an index of the one or more of the plurality of dividers that fail may include calculating the duty cycle of the input signal using the following equation if the relationship of the duty cycle of the input signal to a 50% duty cycle is determined to be less than the 50% duty cycle:

$$\text{Duty Cycle (in \%)} = 50\% * (n'-i)/(n')$$

where n' is a failure index for a divider in the second input path for a 50% duty cycle input signal, and n'−i is the second index.

If none of the dividers fail, then it is determined that the duty cycle of the input signal is 50% (step 850). Thereafter, or after calculating the duty cycle, an output of the results of the duty cycle measurement may be output (step 860). For example, this output may be a signal that is utilized to adjust the duty cycle of the input signal, an output signal indicative of the duty cycle for use in generating a human recognizable indication of the duty cycle, or the like. The operation then terminates.

It should be appreciated that the portions of the illustrative embodiments may take the form of an entirely hardware embodiment, an entirely software embodiment or an embodiment containing both hardware and software elements. In one exemplary embodiment, the mechanisms of the illustrative embodiments are implemented in hardware, such as in the duty cycle characterization circuitry described above, but with software control and computation of duty cycle via computing device/controller 395. The software may be provided, for example, in firmware, resident software, microcode, etc.

Furthermore, the portions of the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

Moreover, the circuitry as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly.

The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in an integrated circuit device, for determining a duty cycle elan input signal, comprising:
    receiving the input signal in a duty cycle measurement circuit having a plurality of dividers, wherein the input signal is received as an input to a plurality of pulse shaper elements, wherein each pulse shaper element delays a poise of the input signal by a predetermined delay amount $\tau$, wherein the plurality of pulse shaper elements comprises a first input signal path and a second input signal path;
    determining if one or more of the plurality of dividers fail;
    determining a relationship of a duty cycle of the input signal to a 50% duty cycle based on the determined one or more of the plurality of dividers that fail; and
    calculating the duly cycle of the input signal based on the determined relationship and an index of the one or mere of the plurality of dividers that fail, wherein calculating the duty cycle of the input signal based on the determined relationship and the index of the one or more of the plurality of dividers that fail comprises either:
    calculating the duty cycle of the input signal using the following equation if the relationship of the duty cycle of the input signal to a 50% duty cycle is determined to be greater than the 50% duty cycle:

Duty Cycle (in %)=50%*(n+i)/(n)

where n is a failure index for a divider in the first input path for a 50% duty cycle input signal, and n+i is the first index: or
    calculating the duty cycle of the input signal using the following equation if the relationship of the duty cycle of the input signal to a 50% duty cycle is determined to be less than the 50% duty cycle;

Duty Cycle (in %)=50%*(n'−i)/(n')

where n' is a failure index for a divider in the second input path for a 50% duty cycle input signal, and n'−i is the second index.

2. The method of claim 1, wherein, in the first input signal path, a first set of pulse shaper elements are connected in series such that a first pulse shaper element in the first input path expands a logic high pulse of the input signal by $\tau$, a second pulse shaper element in the first input path expands the logic high pulse by $2\tau$, up to an nth pulse shaper element in the first input path that expands the logic high pulse by $n\tau$.

3. The method of claim 2, wherein, in the second input signal path, a second set of pulse shaper elements are connected in series such that a first pulse shaper element in the second input path expands a logic low pulse of the input signal by $\tau$, a second pulse shaper element in the second input path expands the logic low pulse by 2τ, up to an n'th pulse shaper element in the second input path that expands the logic low pulse by n'τ.

4. The method of claim 3, wherein determining the relationship of the duty cycle of the input signal to the 50% duty cycle based on the determined one or more of the plurality of dividers that fail comprises:
   determining the first index of a first failed divider in the first input path identified as having failed;
   determining the second index of a first failed divider in the second input path identified as having failed; and
   determining the relationship of the duty cycle of the input signal to the 50% duty cycle based on the first index and the second index.

5. The method of claim 4, wherein determining the relationship of the duty cycle of the input signal to the 50% duty cycle based on the first index and the second index comprises;
   determining if the first index is less than the second index;
   determining that the duty cycle of the input signal is greater than 50% if the first index is less than the second index;
   determining if the first index is greater than the second index; and
   determining that the duty cycle of the input signal is less than 50% if the first index is greater than the second index.

6. The method of claim 3, wherein an output of each of the pulse shaper elements in the plurality of pulse shaper elements is coupled to a divider in the plurality of dividers.

7. The method of claim 6, wherein an output of each of the dividers in the plurality of dividers is coupled to a multiplexer, and wherein the multiplexer selects pairs of outputs from the plurality of dividers for use in determining if one or more of the plurality of dividers fail.

8. The method of claim 7, wherein outputs from the multiplexer are coupled to a pair of flip-flops whose outputs are coupled to a logic gate, and wherein the logic gate outputs a signal indicative of whether one of the dividers in the plurality of dividers fail.

9. The method of claim 3, wherein an output of each of the pulse shaper elements is coupled to a multiplexer, and wherein the multiplexer selects pairs of outputs from the pulse shaper elements for use in determining if one or more of the plurality of dividers fail.

10. The method of claim 9, wherein the plurality of dividers are coupled to outputs of the multiplexer, outputs of the plurality of dividers are coupled to a pair of flip-flops whose outputs are coupled to a logic gate, and wherein the logic gate outputs as signal indicative of whether one of the dividers in the plurality of dividers fail.

11. A duty cycle measurement apparatus, comprising;
   a plurality of pulse shaper elements;
   a multiplexer coupled to the plurality of pulse shaper elements wherein the plurality of pulse shaper elements comprises a first input signal path and a second input signal path;
   a plurality of dividers coupled to the multiplexer; and
   a controller coupled to the multiplexer, wherein:
      the plurality of pulse shaper elements receive an input signal and shape a pulse of the input signal by introducing a predetermined delay τ,
      the multiplexer, based on control signals from the controller, selects pairs of outputs from one of the plurality of pulse shaper elements or the plurality of dividers for use in determining if one or more of the plurality of dividers fail,
      the controller determines a relationship of a duty cycle of the input signal to a 50% duty cycle based on the determined one or more of the plurality of dividers that fail, and
      the controller calculates a duty cycle of the input signal based on the determined relationship and an index of the one or more of the plurality of dividers that fail,
   wherein calculating the duty cycle of the input signal based on the determined relationship and the index of the one or more of the plurality of dividers that fail comprises either:
      calculating the duty cycle of the input signal using the following equation if the relationship of the duty cycle of the input signal to the 50% duty cycle is determined to be greater than the 50% duty cycle:

Duty Cycle (in %)=50%*$(n+i)/(n)$ where n is a failure index for a divider in the first input path for a 50% duty cycle input signal, and n+i is a first index; or
      calculating the duty cycle of the input signal using the following equation if the relationship of the duty cycle of the input signal to the 50% duty cycle is determined to be less than the 50% duty cycle:

Duty Cycle (in %)=50%*$(n'-i)/(n')$ where n' is a failure index for a divider in the second input path for a 50% duty cycle input signal, and n'−i is second index.

12. The apparatus of claim 11, wherein, in the first input signal path, a first set of pulse shaper elements are connected in series such that a first pulse shaper element in the first input path expands a logic high pulse of the input signal by τ, a second pulse shaper element in the first input path expands the logic high pulse by 2τ, up to an nth pulse shaper element in the first input path that expands the logic high pulse by nτ, and wherein, in the second input signal path, a second set of pulse shaper elements are connected in series such that a first pulse shaper element in the second input path expands a logic low pulse of the input signal by τ, a second pulse dialer element in the second input path expands the logic low pulse by 2τ, up to an n'th pulse shaper element in the second input path that expands the logic low pulse by n'τ.

13. The apparatus of claim 12, wherein the controller determines the relationship of the duty cycle of the input signal to the 50% duty cycle based on the determined one or more of the plurality of dividers that fail by:
   determining the first index of a first failed divider in the first input path identified as having failed;
   determining the second index of a first failed divider in the second input path identified as having failed;
   determining if the first index is less than the second index;
   determining that the duty cycle of the input signal is greater than 50% if the first index is less than the second index;
   determining if the first index is greater than the second index; and
   determining that the duty cycle of the input signal is less than 50% if the first index is greater than the second index.

14. The apparatus of claim 12, wherein an output of each of the pulse shaper elements in the plurality of pulse shaper elements is coupled to a divider in the plurality of dividers.

15. The apparatus of claim 11, further comprising:
   a pair of flip-flops coupled to the multiplexer; and
   a logic gate coupled to outputs of the pair of flip-flops, wherein the logic gate outputs a signal indicative of whether one of the dividers in the plurality of dividers fail.

16. The apparatus of claim 11, further comprising:
a pair of flip-flops coupled to outputs of the plurality of dividers, and
a logic gate coupled to outputs of the pair of flip-flops, wherein the plurality of dividers are coupled to outputs of the multiplexer, and wherein the logic gate outputs a signal indicative of whether one of the dividers in the plurality of dividers fail.

* * * * *